(12) United States Patent
Yang

(10) Patent No.: US 6,625,774 B1
(45) Date of Patent: Sep. 23, 2003

(54) REDUNDANCY SYSTEM AND METHOD FOR LOCATING ERRORS IN INTERLEAVED CODE WORDS

(75) Inventor: Honda Yang, Saratoga, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/429,039

(22) Filed: Oct. 29, 1999

(51) Int. Cl.$^7$ ............................................. H03M 13/00
(52) U.S. Cl. ...................................... 714/755; 714/762
(58) Field of Search ................................. 714/755, 756, 714/761, 762, 769, 770

(56) References Cited

U.S. PATENT DOCUMENTS

| | | | | |
|---|---|---|---|---|
| 4,185,269 A | * | 1/1980 | Hodges et al. | 714/762 |
| 4,317,201 A | * | 2/1982 | Sedalis | 714/766 |
| 4,541,092 A | * | 9/1985 | Sako et al. | 714/756 |
| 5,003,539 A | * | 3/1991 | Takemoto et al. | 714/785 |
| 5,392,299 A | * | 2/1995 | Rhines et al. | 714/755 |
| 5,450,421 A | * | 9/1995 | Joo et al. | 714/755 |
| 5,696,774 A | * | 12/1997 | Inoue et al. | 714/755 |
| 5,712,861 A | * | 1/1998 | Inoue et al. | 714/752 |
| 5,781,565 A | * | 7/1998 | Sako et al. | 714/755 |
| 5,809,042 A | * | 9/1998 | Nakamura et al. | 714/755 |
| 5,917,836 A | * | 6/1999 | Ichikawa et al. | 714/755 |
| 6,041,431 A | * | 3/2000 | Goldstein | 714/756 |
| 6,112,324 A | * | 8/2000 | Howe et al. | 707/205 |
| 6,115,837 A | * | 9/2000 | Nguyen et al. | 714/756 |

OTHER PUBLICATIONS

"Error Control Systems" by Stephen Wicker (1995 Prentice–Hall).*
Sitaraman, R.K. and Jha, N.K.; Optimal design of checks for error detection and location in fault–tolerant multiprocessor systems; IEEE Transactions on Computers, vol.: 42 Issue: 7, Jul. 1993, pp.: 780–793.*

* cited by examiner

Primary Examiner—Albert Decady
Assistant Examiner—Joseph D. Torres
(74) Attorney, Agent, or Firm—Lisa K. Jorgenson; Andre Szuwalski

(57) ABSTRACT

An iterative method and system are disclosed for locating errors in interleaved code words. The system and method generate column parity check symbols using symbols from selected columns in the interleaved code words. The width of each column parity check symbol is reduced, followed by the reduced column parity check symbols being merged to create merged column check symbols. A Reed-Solomon encoding algorithm is performed on the merged column check symbols to generate error locating check symbols which are combined with the reduced column parity check symbols to create an error locating code word. The error locating check symbols are stored with the interleaved code words in memory. Following retrieval from memory, the error locating code word is reconstructed and decoded upon the detection of at least one uncorrectable interleaved code word from decoding the interleaved code words. Errors identified from decoding the error locating code word are marked as erasures in the appropriate columns of the interleaved code words. Decoding of the previously uncorrectable interleaved code words is subsequently performed.

24 Claims, 7 Drawing Sheets

Burst Errors Evenly Distributed and All Column Errors Detected

| | Error Locating Interleaved Code (5-way interleave) | | Conventional Interleaved Code (10-way interleave) | | | |
|---|---|---|---|---|---|---|
| correctable burst length | check symbols per interleave | Error Locating Check Symbols | total check symbols | check symbols per interleave | total check symbols | savings (symbols) | savings (percents) |
| 30 | 6 | 6 | 36 | 6 | 60 | 24 | 40% |
| 40 | 8 | 8 | 48 | 8 | 80 | 32 | 40% |
| 50 | 10 | 10 | 60 | 10 | 100 | 40 | 40% |
| 60 | 12 | 12 | 72 | 12 | 120 | 48 | 40% |

FIG. 5

Burst Errors Unevenly Distributed and One Column Error Undetected

| | Error Locating Interleaved Code (5-way interleave) | | Conventional Interleaved Code (10-way interleave) | | | |
|---|---|---|---|---|---|---|
| correctable burst length | check symbols per interleave | Error Locating Check Symbols | total check symbols | check symbols per interleave | total check symbols | savings (symbols) | savings (percents) |
| 30 | 7 | 8 | 43 | 6 | 60 | 17 | 28% |
| 40 | 9 | 10 | 55 | 8 | 80 | 25 | 31% |
| 50 | 11 | 12 | 67 | 10 | 100 | 33 | 33% |
| 60 | 13 | 14 | 79 | 12 | 120 | 41 | 34% |

FIG. 6

REDUNDANCY SYSTEM AND METHOD FOR LOCATING ERRORS IN INTERLEAVED CODE WORDS

BACKGROUND OF THE INVENTION

Technical Field of the Invention

The present invention relates to locating errors in interleaved code words, and particularly to a system and method for providing additional error locating capability with relatively little overhead.

BACKGROUND OF THE INVENTION

Existing data storage devices, such as disk drives, utilize Reed-Solomon error correcting codes to perform burst error correction and to achieve higher storage densities. The capability to correct multiple error bursts in near real time is necessary to minimize error recovery time and avoid the interruption of data flow.

Because magnetic data storage devices tend to generate errors in bursts, data stored on magnetic storage devices is typically arranged in an interleaved format. Interleaving is often used to spread the consecutive error bits or symbols into different interleaves which can each be corrected individually. Because interleaving allows the same hardware decoder core to process multiple interleaves repeatedly, interleaving is a cost effective technique to effectively combat burst errors.

Conventional interleaved coding techniques, however, are not without their shortcomings. For instance, interleaved code words have the same number of redundant check symbols and thus possess the same error correction capability. It has been observed that random errors may concentrate in one or two interleaves instead of substantially all interleaves. This concentration of random errors serves to defeat the effectiveness of providing redundant check symbols in each interleaved code word. Concerning long burst errors, a correlation exists between error locations in different interleaved code words. If all of the burst error locations can be identified and marked as erasures for the interleaved code words, error and erasure decoding can more successfully correct interleaved code words. Based upon the foregoing, there exists a need for a system and method for efficiently providing an error locating coding scheme that is tailored to locate errors typically encountered in a magnetic storage medium.

SUMMARY OF THE INVENTION

The present invention overcomes the shortcomings in prior systems and thereby satisfies a significant need for a system and method for efficiently locating errors in interleaved code words stored in a storage device. The system selectively provides additional check symbols to increase the power of uncorrectable interleaved code words without a substantial increase in overhead.

Conventional interleaved code words may be viewed as row codes wherein each interleaved code word includes a plurality of information symbols and a plurality of check symbols. In the preferred embodiments of the present invention, an error locating code word is created from selected columns of each interleaved code word. The error locating code word is stored with the corresponding interleaved code words in memory. The error locating code word is created in part by utilizing the same Reed-Solomon generator polynomial that is used in the formation of the interleaved code words.

The preferred embodiments of the present invention include software and hardware necessary for initially scrambling the symbols from the selected columns of the interleaved code words and creating column parity check symbols from the scrambled symbols. Each column parity check symbol, created using an operator such as an exclusive-OR boolean operator, is as wide as the width of a symbol extracted from the interleaved code word. The system software and hardware performs an operation on the high and low nibbles of each column parity check symbol to generate a plurality of reduced column parity check symbols, wherein each reduced column parity check symbol has a width that is half the width of each column parity check symbol. The software and hardware merges together pairs of the reduced column parity check symbols corresponding to two separate columns of the interleaved code words to create a plurality of merged column check symbols. The encoding operation is complete upon performing a Reed-Solomon encoding operation on the merged column check symbols to create error locating check symbols. The error locating code word is formed from the merged column check symbols and the error locating check symbols Following retrieval of the interleaved code words and corresponding error locating check symbols from the storage device, the merged column check symbols are reconstructed from the symbols of the selected columns of the retrieved interleaved code words using the same encoding procedure used to generate the error locating code word. At around the same time the interleaved code words are decoded, the reconstructed merged column check symbols are used to compute the partial syndromes of the error locating code word. Upon the affirmative determination of the presence of error locations and patterns in a decoded interleaved code word, the partial syndromes of the error locating code word are modified accordingly.

The system software and hardware decodes the error locating code word upon the affirmative determination of any uncorrectable interleaved code words. A Reed-Solomon decoding operation is used to decode the error locating code word. Noting that a merged column check symbol corresponds to two selected columns in the interleaved code words, the column of the interleaved code word is identified for each error in the decoded error locating code word. The symbols in the identified columns of the previously uncorrectable interleaved code words are then marked as erasures. Error and erasure decoding of the uncorrectable interleaved code words is then performed a second time.

BRIEF DESCRIPTION OF THE DRAWINGS

A more complete understanding of the system and method of the present invention may be obtained by reference to the following Detailed Description when taken in conjunction with the accompanying Drawings wherein:

FIGS. 5–7 illustrate the results of the coding operation according to the preferred embodiment of the present invention shown in FIG. 1.

DETAILED DESCRIPTION OF THE PREFERRED EXEMPLARY EMBODIMENTS

Figure 1:
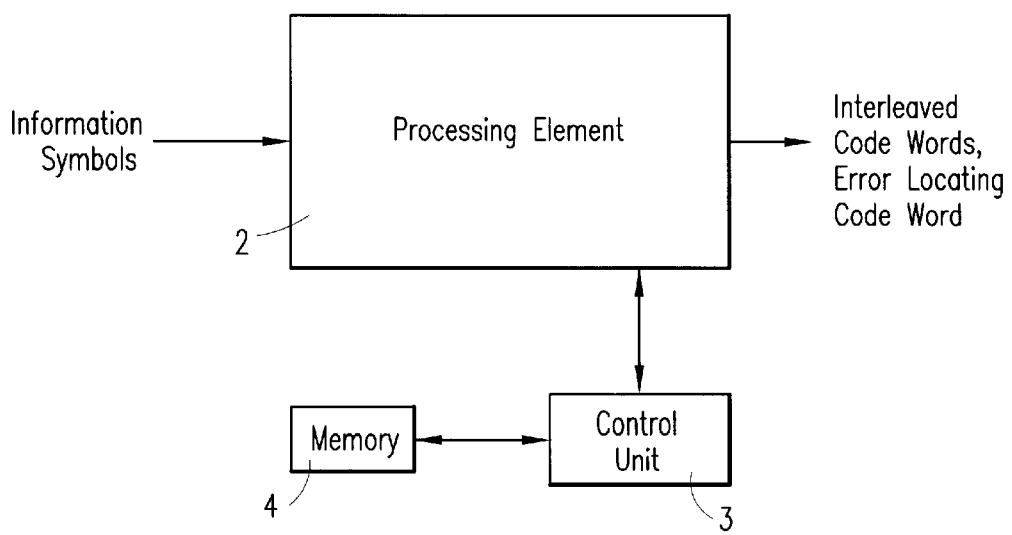
FIG. 1 is a block diagram of a coding system according to a preferred embodiment of the present invention.

Referring to FIG. 1, there is disclosed a coding system 1 according to a preferred embodiment of the present invention. Coding system 1 may be part of a data storage system, such as a hard disk controller of a hard disk drive. In general terms, coding system 1 is adapted to provide redundancy for performing error detection and correction using, in addition to interleaved check symbols, error locating check symbols generated from selected columns of the interleaved code words.

According to the preferred embodiments of the present invention, coding system 1 may be implemented with a processing element 2 that encodes and decodes data using a Reed-Solomon error correction algorithm. Coding system 1 may further include a control unit 3 which configures processing element 2 to perform encoding and decoding operations. Memory 4 preferably stores system software which may be utilized by control unit 3 in controlling processing element 2 to perform encoding and decoding operations according to the preferred embodiment of the present invention.

It is understood that coding system 1 may be alternatively implemented in ways other than as a programmed processing element.

As stated above, the conventional interleaved code words may be viewed as row codes. Coding system 1, according to the preferred embodiment of the present invention, generates a column code word from symbols in selected columns of each interleaved code word. A limited number and size of column code words are created for reasons of economy in storing data in a data storage device. Consequently, the created column code words are utilized only for error detection purposes.

Figure 2:
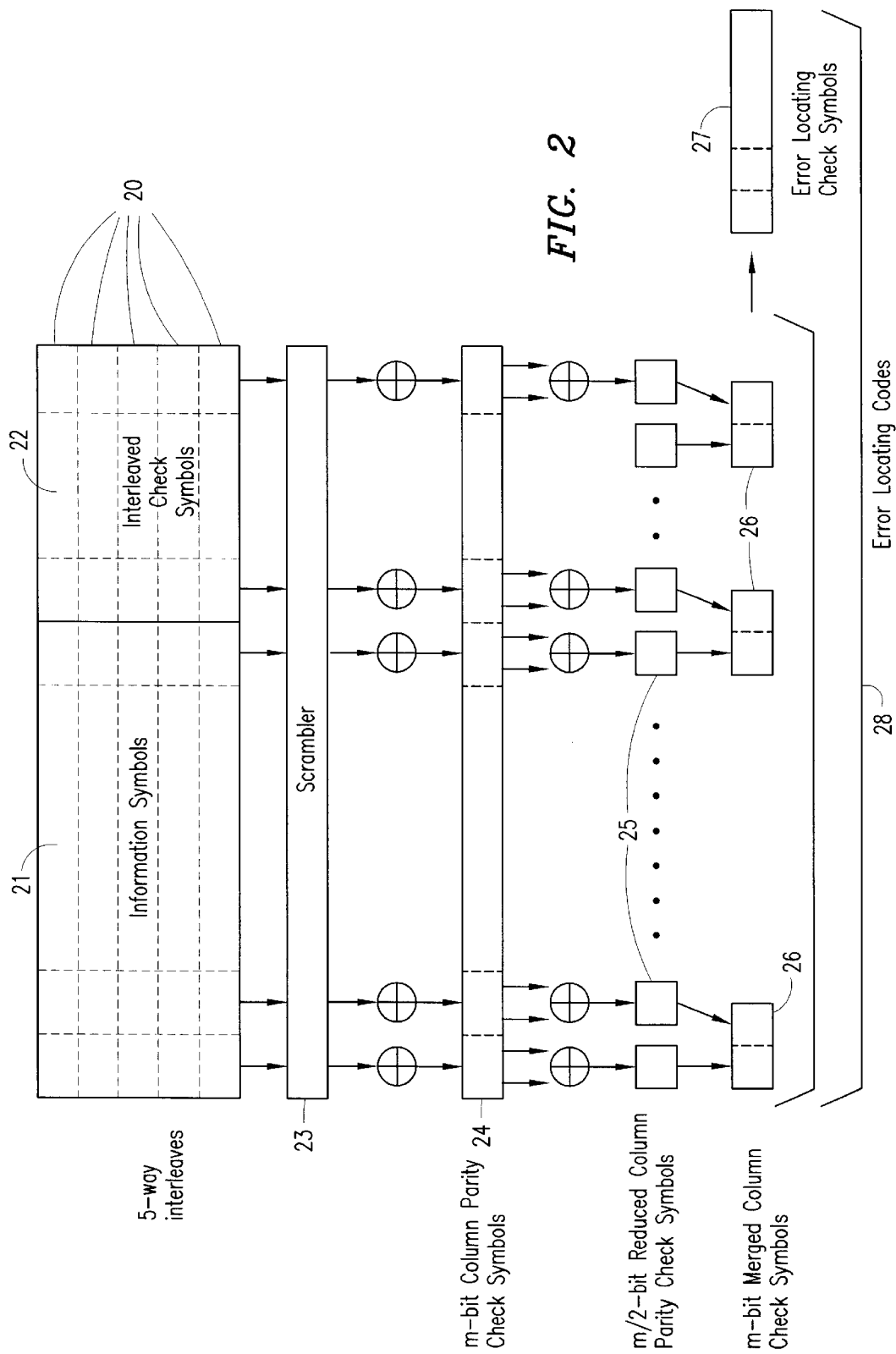
FIG. 2 is a diagram illustrating an interleaved coding pattern according to the preferred embodiment of the present invention shown in FIG. 1.

Referring to FIG. 2, there is shown a coding scheme used by coding system 1 for constructing error locating check symbols from selected columns of interleaved code words 20. The interleaved code words 20 are shown having a five-way interleaved configuration for exemplary purposes only. It is understood that the degree of the interleaved code words 20 may be other than five depending upon the particular application.

Processing element 2 and control unit 3 construct at least one set of error locating code words from selected columns of either or both of the information symbols 21 and the check symbols 22 of the interleaved code words 20. For each selected column, a symbol from each interleaved code word 20 is extracted and/or used to create the error locating code word.

Processing element 2 and control unit 3 may be configured as a scrambler 23 in performing a scrambling operation on the symbols from the selected columns of the interleaved code words 20. The scrambler 23 reorders the extracted column symbols. Scrambler 23 prevents simple error patterns from being undetected.

Processing element 2 and control unit 3 perform the scrambling operation to also avoid error pattern sensitivity. For example, identical error patterns in the low and high nibbles of a symbol may cancel each other when generating reduced column parity check symbols. Identical error patterns on every symbol of the same column may also cancel each other when generating reduced column parity check symbols. By randomizing the error patterns in scrambler 23, the constructed error locating check symbols may be substantially insensitive to error patterns.

Randomizing the error patterns may be performed by multiplying every symbol extracted from the interleaved code words 20 by a pseudo-random pattern generator. Assuming that the information symbols 21 and interleaved check symbols 22 of interleaved code words 20 are eight bits wide, each nibble of the extracted symbols is multiplied by a distinct field element in the GF polynomial GF(16). For instance, in the case of an i-way interleave configuration with eight bit wide symbols, the low nibble of the i-1 interleaved code word 20 is multiplied by $\beta^0$, the second nibble of the i-1 interleaved code word 20 is multiplied by $\beta^0$, the first nibble of the i-2 interleaved code word 20 is multiplied by $\beta^2$, etc., where $\beta$ is a primitive element in GF(16).

Having produced scrambled symbols from scrambler 23, processing element 2 and control unit 3 generate column parity check symbols 24 by performing an exclusive-OR boolean operation on the scrambled symbols. Each column parity check symbol 24 has the same width as the width of the symbols extracted from the interleaved code words 20. By performing an exclusive-OR boolean operation on the high and low nibbles of each column parity check symbol 24, processing element 2 and control unit 3 generate a set of reduced column parity check symbols 25, with each reduced column parity check symbol 25 having a width that is half the width of the corresponding column parity check symbol 24. Pairs of the reduced column parity check symbols 25 from two separate columns are combined by processing element 2 and control unit 3 to create a plurality of merged column check symbols 26. Each merged column check symbol 26 has twice the width as the corresponding reduced column parity check symbols 25.

Upon the generation of the merged column check symbols 26, processing element 2 and control unit 3 perform a Reed-Solomon encoding operation on the merged column check symbols 26 to create error locating check symbols 27. The Reed-Solomon encoding operation may, for example, utilize a generator polynomial to create the error locating check symbols 27. The Reed-Solomon encoding operation performed on the merged column check symbols is preferably the same Reed-Solomon operation performed on the information symbols 21 to create the interleaved check symbols 22. Each error locating check symbol 27 has the same width as the width of a merged column check symbol 26.

The merged column check symbols 26 and the error locating check symbols 27 are combined to form a single error locating code word 28. The error locating check symbols 27 are stored with the corresponding interleaved code words 20 in a data storage device (not shown). The merged column check symbols 26, which combine with the error locating check symbols 27 to form the error locating code word 28, are not stored in the data storage device.

It is understood that operators other than exclusive-OR operators may be utilized in constructing the error locating code word 28. It is also understood that encoding operations and/or algorithms may be utilized in forming the interleaved code words 20 and the error locating code word 28 other than a Reed-Solomon encoding algorithm.

The number of error locating check symbols 27 is programmable by coding system 1. The total number of error locating check symbols 27 is usually an even number. The minimum number of error locating check symbols 27 is two. Because having more erasures than the number of check symbols in an interleaved code word 20 provides little additional value in locating or otherwise handling errors, the number of error locating check symbols 27 is equal to the check symbols 22 per interleaved code word 20 in order to effectively handle single evenly distributed long burst errors. Providing a relatively sizeable number of error locating check symbols 27, however, will advantageously identify and/or correct burst errors that are not evenly distributed among the interleaved code words 20 or in a random error situation.

According to a preferred embodiment of the present invention, coding system 1 additionally performs a decoding operation to decode interleaved code words 20 as well as to selectively decode the error locating code word 28. Processing element 2 and control unit 3 are capable of performing error and erasure decoding on the interleaved code words 20 and error locating code word 28. As a part of the decoding operation, processing element 2 and control unit 3 are capable of creating the partial syndromes of error locating code 28 and modifying the partial syndromes of error locating code 28 based upon error locations and patterns identified by decoding the interleaved code words 20. The generation of partial syndromes of error locating code 28 from reconstruction of merged column check symbols 26 and the modification of the partial syndromes will be described below.

Processing element 2 and control unit 3 are also capable of iteratively performing error and erasure decoding on the interleaved code words 20 in the event one or more uncorrectable interleaved code words are initially detected. Performing an error and erasure decoding operation on error locating code 28 allows coding system 1 to identify columns in the uncorrectable interleaved code words 20 which are to be marked as erasures. Subsequent error and erasure decoding operations will be performed on the previously uncorrectable interleaved code words 20 following the marking as erasures therein of those columns corresponding to error(s) identified from decoding error locating code word 28, as explained below.

Figure 3:
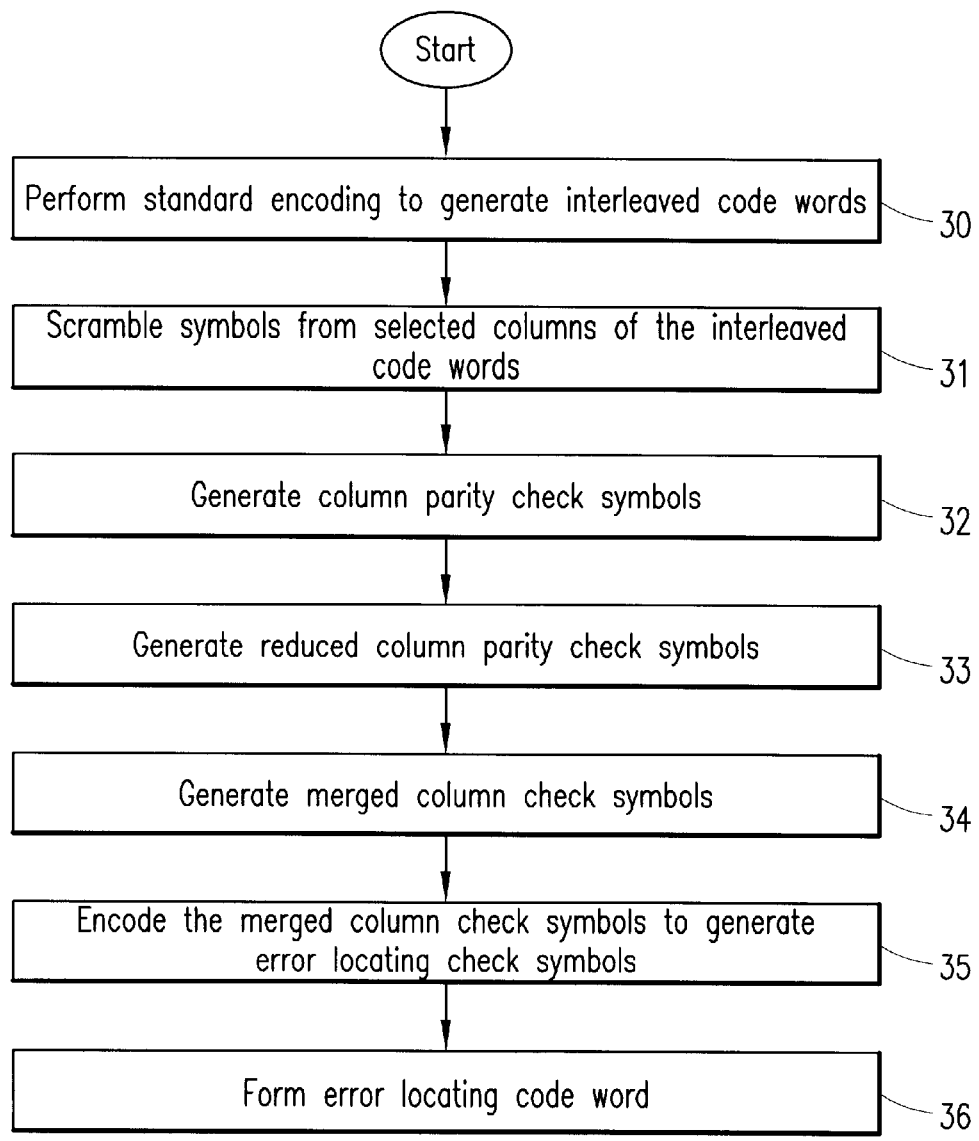
FIG. 3 is a flow chart illustrating the encoding operation of the preferred embodiment of the present invention of FIG. 1.

The operation of coding system 1 according to a first preferred embodiment of the present invention will be described with reference to FIGS. 3 and 4. When data, organized as information symbols, are to be stored in a data storage device, interleaved code words 20 and a corresponding error locating code word 28 are created and stored. Specifically, conventional Reed-Solomon encoding is performed at step 30 on information symbols 21 to create interleaved check symbols 22 and to thereby form interleaved code words 20. Next, symbols from selected columns of interleaved code words 20 are extracted and scrambled at step 31. Scrambler 23 multiplies each nibble of each extracted symbol by a pseudo-random pattern generator, such as a primitive element in GF(16), in order to prevent error pattern sensitivity. An exclusive-OR operation is performed on the output symbols from scrambler 23 to generate column parity check symbols 24 at step 32. An exclusive-OR operation is performed on the high and low nibbles of each column parity check symbol 24 at step 33 to create reduced column parity check symbols 25. Each reduced column parity check symbol 25 is half as wide as a corresponding column parity check symbol 24.

Next, pairs of the reduced column parity check symbols 25 are combined at step 34 to create the merged column check symbols 26. The error locating check symbols 27 are created at step 35 by performing the same Reed-Solomon encoding operation on the merged column check symbols 26 as the Reed-Solomon encoding operation used in forming the interleaved code words 20. The error locating check symbols 27 are combined with the merged column check symbols 26 to form an error locating code word 28 at step 36. At this point, the encoding operation is complete. Thereafter, the interleaved code words 20 and corresponding error locating check symbols 27 are stored in the data storage device. The merged column check symbols 26 are not similarly stored in the data storage device.

Figure 4:
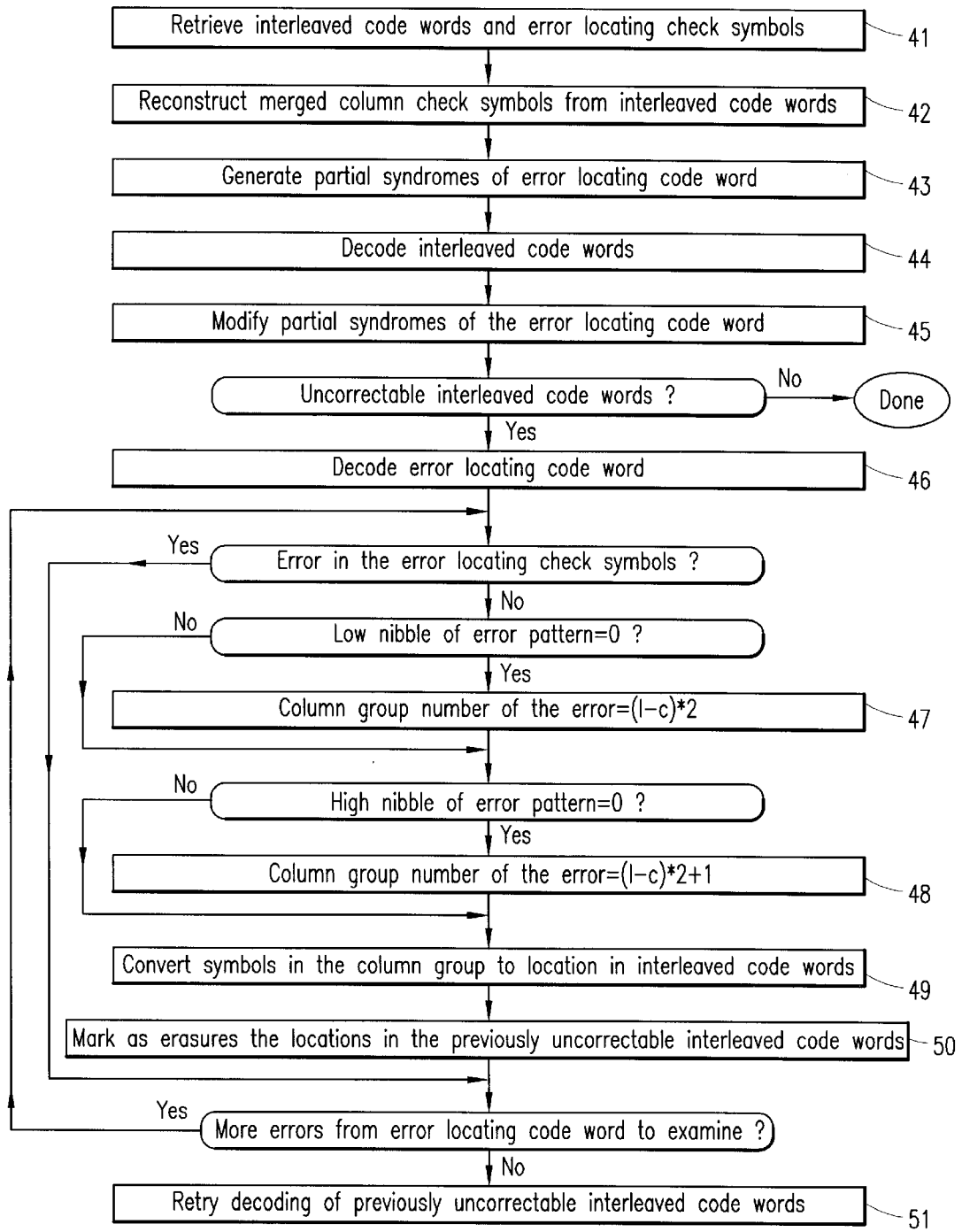
FIG. 4 is a flow chart illustrating the decoding operation of interleaved code words and error locating code word according to a preferred embodiment of the present invention.

The error locating check symbols 27 are retrieved from the data storage device when the corresponding interleaved code words 20 are retrieved therefrom at step 41 (FIG. 4). Coding system 1 reconstructs the merged column check symbols 26 at step 42 from the retrieved interleaved code words 20 using steps 31–34 as described above. The reconstructed merged column check symbols 26, together with the error locating check symbols 27, form the error locating code word 28. The reconstructed merged column check symbols 26 are then used at step 43 to generate partial syndromes of error locating code word 28. At or around the same time, error and erasure decoding of the interleaved code words 20 is performed at step 44. The partial syndromes of the error locating code word 28 are modified at step 45 upon detection of a correctable error in decoding the interleaved code words 20.

In particular, the partial syndromes of the error locating code word 28 are updated. Specifically, the interleaved error location $i_k$, computed by decoding the interleaved code words 20, is first converted to a sector error location with respect to the last interleaved check symbol. The column group number and relative location within a group is then computed. The column group number is divided by two in order to obtain the merged column group number. The actual error location $I_k$ in the error locating code word 28 is the above-identified merged column group number plus the number of error locating check symbols 27.

The error or erasure pattern $e_k$ computed from decoding the interleaved code words 20 is first split into high and low nibbles. Then, depending upon its relative location in a column detection group, the low nibble is multiplied by $\beta^i$ and the high nibble is multiplied by $\beta^{i+1}$, where $\beta$ is a primitive element in GF(16). An exclusive-OR operation is performed on the scrambled high and low nibbles to form the reduced column parity check symbol 25. If the converted column number is odd, the reduced column parity check symbol 25 is shifted to the left four bits (for an eight bit wide symbol) to form the merged column parity check symbol $E_k$. Otherwise, the reduced column parity check symbol 25 is the merged column parity check symbol 26.

The above-identified procedure for modifying the partial syndromes of the error locating code word 28 essentially subtracts the contribution of the errors using the equation $$Sj = Sj - E_k{}^{Ikj}$$

Having modified the partial syndromes of the error locating code word 28, decoding the error locating code word 28 may be performed. Error and erasure decoding of the error locating code word 28 is performed at step 46 if any one interleaved code word 20 is found to be uncorrectable. Every error found by decoding the error locating code word 28 is examined. If an error is found in the error locating check symbols 27, the information is not passed onto the interleaved code word 20. Otherwise, error and erasure decoding of the error locating code word 28 continues.

It is understood that every error symbol found by decoding error locating code word 28 may identify up to two columns of the interleaved code words 20. Based upon the value of the high and low nibbles in the error patterns, the particular column having the error pattern may be determined. Specifically, if the low nibble of the error pattern is not zero, the column group number associated with the error may be determined in step 47 as $$(l-c)*2,$$

where l is the error location and c is the number of error locating check symbols 27. If the high nibble of the error pattern is not zero, the column group number associated with the error may be determined in step 48 as $$(l-c)*2+1.$$

Then, for every symbol in the identified column group(s), the column location thereof is converted to the interleaved location in the interleaved code words 20 at step 49. The column locations identified during step 49 are marked as erasures at step 50 in the previously uncorrectable interleaved code words 20. Steps 47 through 50 are repeated for every error from decoding the error locating code word 28. Thereafter, a second iteration of the error and erasure decoding of the previously uncorrectable interleaved code words 20 is performed at step 51.

The performance of coding system 1 improves the detection of both burst errors and random errors. With respect to burst errors, FIGS. 5 and 6 are tables which respectively illustrate the best and worst performance gain from use of coding system 1, by comparing the results of a conventional ten way interleaved code to a five way interleaved configuration with various error locating check symbols 27 according to a preferred embodiment of the present invention.

Figure 7:
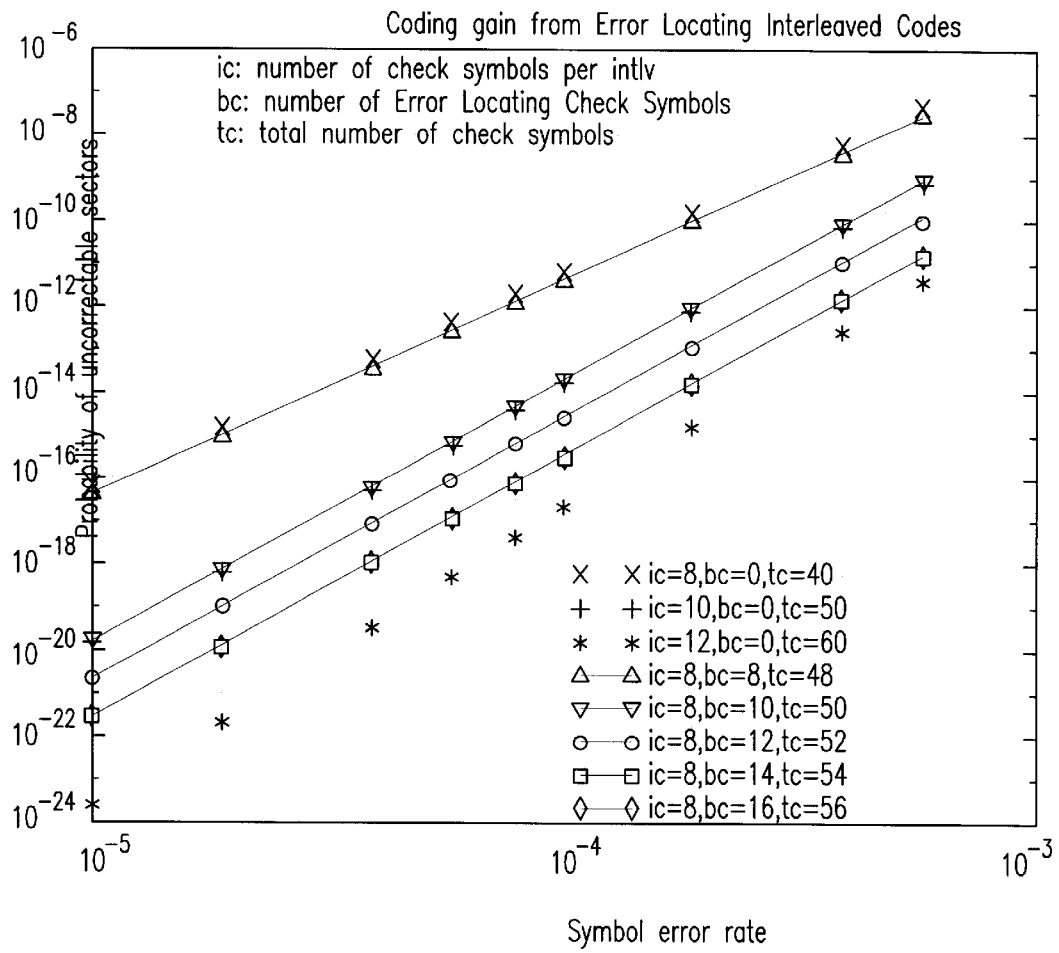

Concerning random errors, FIG. 7 is a plot of symbol error rate versus the probability of uncorrectable sectors for a number of error coding schemes. The error coding schemes include conventional interleaved coding schemes (the plots marked with "×", "+", and "*") as well as coding schemes using error locating code words according to coding system 1 of the present invention (the plots marked with triangles, circles, squares and diamonds).

As can be seen, the performance gain depends on various factors, including the interleaving degree, burst error distributions among the interleaved code words, and the capability of detecting the reduced column check symbols 25. Regardless, the performance gain from use of the system and method of the preferred embodiments of the present invention varied between 28 percent and 40 percent.

Figure 8:
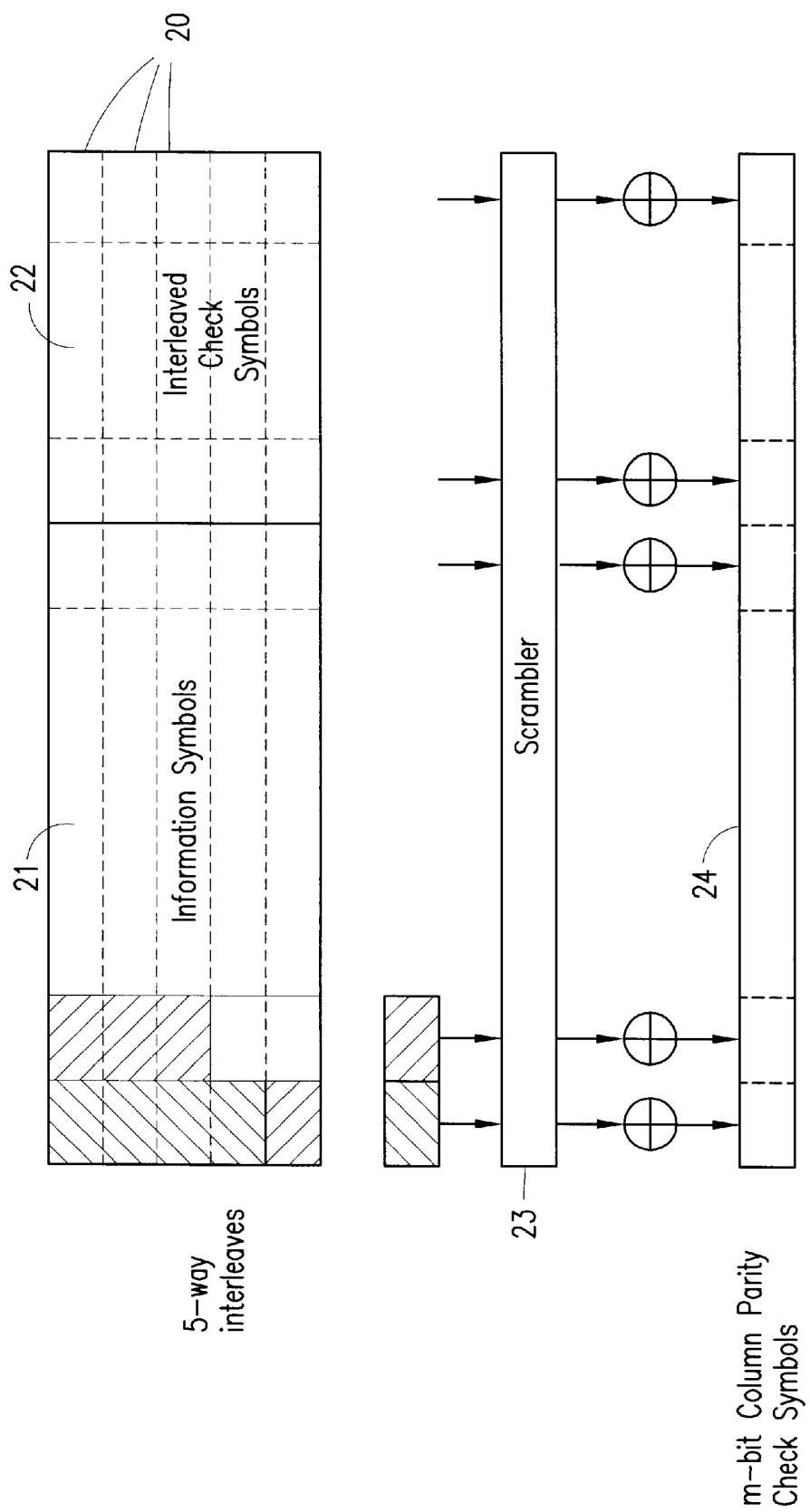
FIG. 8 is a block diagram of a second preferred embodiment of the present invention.

The encoding capability of coding system 1 discussed above utilizes symbols in selected columns from each interleaved code word 20 to generate column parity check symbols 24. A single column parity check symbol 24 is associated with every information symbol 21 in the selected column. The encoding operation according to a second embodiment of the present invention, however, may be configured to utilize more or less than all of the information symbols 21 in a selected column. Referring to FIG. 8, there is shown a five way interleaved configuration in which four information symbols 21 may be extracted and used to create column parity check symbols 24 instead of using all five information symbols 21 in a selected column.

With respect to random errors, the benefit of this encoding scheme is that the number of information symbols 21 in a parity check group can be chosen to match the channel modulation code size. For the relatively long error propagation modulation codes, all of the information symbols in the same modulation code words are likely to be erroneous. This encoding scheme can be used to erase all of the information symbols in the parity check group. Consequently, the error correction capability of the interleaved code words 20 is enhanced.

Concerning burst errors, the number of information symbols in a parity check group can be increased from one column to two so that a single column parity check symbol 24 is associated with two potentially bad columns instead of one. As a result, a greater number of information symbols can be erased. Stated another way, a lesser number of error locating check symbols 27 is needed to correct a burst error of the same length.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of locating errors in data using interleaved coding, comprising the steps of:

generating check symbols from information symbols using an encoding algorithm;

forming interleaved code words from the information symbols and the check symbols;

generating reduced column parity check symbols using symbols from selected columns of the interleaved code words, each reduced column parity check symbol having a width that is less than the width of each information symbol in the interleaved code words from which the reduced column parity check symbol is generated;

prior to the step of generating the reduced column parity check symbols, generating column check symbols using symbols from selected columns of each interleaved code word, each column check symbol having a width substantially matching the width of each symbol in the interleaved code words, the step of generating the reduced column parity check symbols generates the reduced column parity check symbols from the generated column check symbols;

merging reduced column parity check symbols together to form merged column check symbols, each merged column check symbol having the same width as the width of each information symbol in the interleaved code words from which the reduced column parity check symbol is generated;

encoding the merged column check symbols to create error locating check symbols using the same encoding algorithm as the encoding algorithm used to generate the check symbols, the error locating check symbols and the merged column check symbols forming an error locating code word; and storing the interleaved code words and the error locating check symbols in memory.

2. The method of claim 1, wherein:

the step of generating the reduced column parity check symbols utilizes an exclusive-OR boolean operator to generate the reduced column parity check symbols.

3. The method of claim 1, wherein:

the encoding algorithm comprises a Reed-Solomon encoding algorithm.

4. The method of claim 1, further comprising the step of:
prior to the step of generating the reduced column parity check symbols, scrambling the selected symbols from the interleaved code words utilized in the step of generating the reduced column parity check symbols.

5. The method of claim 1, wherein:
each reduced column parity check symbol has a width that is half of the width of each of the symbols of the interleaved code words used to generate the reduced column parity check symbols.

6. The method of claim 1, wherein the step of storing comprises storing the interleaved code words and the error locating check symbols in memory without storing the reduced column parity check symbols and the merged column parity check symbols.

7. A method of locating errors in data using interleaved coding, comprising the steps of:
generating check symbols from information symbols using an encoding algorithm;
forming interleaved code words from the information symbols and the check symbols;
generating reduced column parity check symbols using symbols from selected columns of the interleaved code words, each reduced column parity check symbol having a width that is less than the width of each information symbol in the interleaved code words from which the reduced column parity check symbol is generated;
merging reduced column parity check symbols together to form merged column check symbols, each merged column check symbol having the same width as the width of each information symbol in the interleaved code words from which the reduced column parity check symbol is generated;
encoding the merged column check symbols to create error locating check symbols using the same encoding algorithm as the encoding algorithm used to generate the check symbols, the error locating check symbols and the merged column check symbols forming an error locating code word;
storing the interleaved code words and the error locating check symbols in memory;
retrieving the interleaved code words and the error locating check symbols from memory;
decoding the retrieved interleaved code words;
reconstructing the merged column check symbols from the retrieved interleaved code words and forming a reconstructed error locating code word including the retrieved error locating check symbols and the reconstructed merged column check symbols;
selectively decoding the reconstructed error locating code word upon an affirmative determination that the retrieved interleaved code word is uncorrectable during the step of decoding; and
marking as erasures for the previously uncorrectable retrieved interleaved code words error locations identified during the step of selectively decoding.

8. The method of claim 7, further comprising the step of:
decoding the uncorrectable interleaved code words, the error locations identified during the step of selectively decoding being marked as erasures in the uncorrectable retrieved interleaved code words.

9. The method of claim 7, further comprising the steps of:
computing the partial syndromes of the reconstructed error locating code word; and
modifying the partial syndromes of the reconstructed error locating code word based upon errors identified during the step of decoding the retrieved interleaved code words, the modified partial syndromes of the reconstructed error locating code word being utilized in decoding the reconstructed error locating code word.

10. The method of claim 9, wherein the step of modifying comprises the steps of:
for each error location identified during the step of decoding the retrieved interleaved code words, computing the actual error location in the reconstructed error locating code word;
for each error pattern identified during the step of decoding the retrieved interleaved code words, determining the merged column parity check symbol relating to the error pattern; and
updating the partial syndrome based upon the actual error location and the determined merged column parity check symbol.

11. The method of claim 7, wherein the step of selectively decoding comprises the step of:
identifying a merged column check symbol having an error; and
identifying the column of the retrieved interleaved code word corresponding to the error;
wherein the step of marking marks as an erasure the symbol of the retrieved interleaved code word in the identified column.

12. A computer program product including a computer readable medium having computer readable program code means embodied thereon, to be executed by a processing element for locating errors in data stored in data memory, the computer program product comprising:
first computer readable program code means for generating check symbols from information symbols using an encoding algorithm;
second computer readable program code means for forming interleaved code words from the information symbols and the check symbols;
third computer readable program code means for generating column check symbols using symbols from selected columns of each interleaved code word, each column check symbol having a width substantially matching the width of each symbol used in the interleaved code words, and generating reduced column parity check symbols using the generated column check symbols, each reduced column parity check symbol having a width that is less than the width of each information symbol in the interleaved code words from which the reduced column parity check symbol is generated;
fourth computer readable program code means for merging reduced column parity check symbols together to form merged column check symbols, each merged column check symbol having the same width as the width of each information symbol in the interleaved code words from which the reduced column parity check symbol is generated;
fifth computer readable program code means for encoding the merged column check symbols to create error locating check symbols using the same encoding algorithm as the encoding algorithm used to generate the check symbols, the error locating check symbols and the merged column check symbols forming an error locating code word; and sixth computer readable program code means for storing the interleaved code words and the error locating check symbols in memory.

13. The computer program product of claim 12, wherein: the third computer readable program code means generates the reduced column parity check symbols using an exclusive-OR boolean operator the symbols from the selected columns of the interleaved code words.

14. The computer program product of claim 12, wherein: the encoding algorithm comprises a Reed-Solomon algorithm.

15. The computer program product of claim 12, further comprising:
an eleventh computer readable program code means for scrambling the symbols from the selected columns of the interleaved code words, the scrambled symbols being used by the third computer readable program code means for the generation of the reduced column parity check symbols.

16. The computer program product of claim 12, wherein: each reduced column parity check symbol has a width that is half the width of each of the symbols in the selected columns of the interleaved code words used to generate the reduced column parity check symbols.

17. A computer program product including a computer readable medium having computer readable program code means embodied thereon, to be executed by a processing element for locating errors in data stored in data memory, the computer program product comprising:
first computer readable program code means for generating check symbols from information symbols using an encoding algorithm;
second computer readable program code means for forming interleaved code words from the information symbols and the check symbols;
third computer readable program code means for generating reduced column parity check symbols using symbols from selected columns of the interleaved code words, each reduced column parity check symbol having a width that is less than the width of each information symbol in the interleaved code words from which the reduced column parity check symbol is generated;
fourth computer readable program code means for merging reduced column parity check symbols together to form merged column check symbols, each merged column check symbol having the same width as the width of each information symbol in the interleaved code words from which the reduced column parity check symbol is generated;
fifth computer readable program code means for encoding the merged column check symbols to create error locating check symbols using the same encoding algorithm as the encoding algorithm used to generate the check symbols, the error locating check symbols and the merged column check symbols forming an error locating code word; and
sixth computer readable program code means for storing the interleaved code words and the error locating check symbols in memory;
seventh computer readable program code means for retrieving the interleaved code words and the error locating check symbols from memory;
eighth computer readable program code means for decoding the retrieved interleaved code words;

ninth computer readable program code means for reconstructing the merged column check symbols from the retrieved interleaved code words and selectively forming a reconstructed error locating code word and decoding the reconstructed error locating code word upon an affirmative determination that the retrieved interleaved code word is uncorrectable by the eighth computer readable program code means; and
tenth computer readable program code means for marking as erasures in the previously uncorrectable retrieved interleaved code words error locations identified by the ninth computer readable program code means.

18. The computer program product of claim 17, further comprising:
eleventh computer readable program code means for decoding the uncorrectable retrieved interleaved code words, the error locations identified being marked as erasures in the uncorrectable retrieved interleaved code words.

19. The computer program product of claim 17, further comprising:
eleventh computer readable program code means for computing the partial syndromes of the reconstructed error locating code word; and
twelfth computer readable program code means for modifying the partial syndromes of the reconstructed error locating code word based upon errors identified during the step of decoding the retrieved interleaved code words, the modified partial syndromes of the reconstructed error locating code word being utilized in decoding the reconstructed error locating code word.

20. The computer program product of claim 19, further comprising:
thirteenth computer readable program code means for computing the actual error location in the reconstructed error locating code word for each error location identified by the eighth computer readable program code means;
fourteenth computer readable program code means for determining the merged column parity check symbol relating to the error pattern for each error pattern identified by the eighth computer readable program code means; and
fifteenth computer readable program code means for updating the partial syndrome based upon the actual error location and the determined merged column parity check symbol.

21. The computer program product of claim 17, wherein the ninth computer readable program code means comprises:
eleventh computer readable program code means for identifying a merged column check symbol having an error; and
twelfth computer readable program code means for identifying the column of the retrieved interleaved code word corresponding to the error;
wherein the tenth computer readable program code means marks as an erasure the symbol of the interleaved code word in the identified column.

22. A coding system for encoding/decoding data stored in data memory, said system comprising:
a processing unit operable to generate check symbols from information symbols; form interleaved code words from the information symbols and the check symbols; generate column check symbols using symbols from selected columns of each interleaved code word, each column check symbol having a width substantially matching the width of each symbol used in the interleaved code words; generate reduced column parity check symbols using the generated column check symbols, each reduced column parity check symbol having a width that is less than the width of each information symbol in the interleaved code words from which the reduced column parity check symbol is generated; merge reduced column parity check symbols together to form merged column check symbols, each merged column check symbol having the same width as the width of each information symbol in the interleaved code words from which the reduced column parity check symbol is generated; encode the merged column check symbols to create error locating check symbols, the error locating check symbols and the merged column check symbols forming an error locating code word; and store the interleaved code words and the error locating check symbols in memory.

23. The coding system of claim 22, further comprising:

a control unit coupled to the processing unit, said control unit is operable to configure the processing unit to generate the check symbols, form the interleaved code words, generate the reduced column parity check symbols, merge the reduced column parity check symbols, encode the merged column check symbols, and store the interleaved code words and the error locating check symbols.

24. A coding system for encoding/decoding data stored in data memory, said system comprising:

a processing unit operable to generate check symbols from information symbols; form interleaved code words from the information symbols and the check symbols; generate reduced column parity check symbols using symbols from selected columns of the interleaved code words, each reduced column parity check symbol having a width that is less than the width of each information symbol in the interleaved code words from which the reduced column parity check symbol is generated; merge reduced column parity check symbols together to form merged column check symbols, each merged column check symbol having the same width as the width of each information symbol in the interleaved code words from which the reduced column parity check symbol is generated; encode the merged column check symbols to create error locating check symbols, the error locating check symbols and the merged column check symbols forming an error locating code word; and store the interleaved code words and the error locating check symbols in memory, wherein the processing unit is further operable to retrieve the interleaved code words and the error locating check symbols from memory; decode the retrieved interleaved code words; reconstruct the merged column check symbols from the retrieved interleaved code words and form a reconstructed error locating code word including the retrieved error locating check symbols and the reconstructed merged column check symbols; selectively decode the reconstructed error locating code word upon an affirmative determination that the retrieved interleaved code word is uncorrectable during the step of decoding; and mark as erasures for the previously uncorrectable retrieved interleaved code words error locations identified during the step of selectively decoding.

* * * * *